(12) United States Patent
Huang et al.

(10) Patent No.: US 11,862,482 B2
(45) Date of Patent: Jan. 2, 2024

(54) SEMICONDUCTOR SUBSTRATE BONDING TOOL AND METHODS OF OPERATION

(71) Applicant: Taiwan Semiconductor Manufacturing Company, Ltd., Hsinchu (TW)

(72) Inventors: Yen-Hao Huang, Hsinchu (TW); Chun-Yi Chen, Hsinchu (TW); I-Shi Wang, Sanxia Township (TW); Yin-Tun Chou, Hsinchu (TW); Yuan-Hsin Chi, Longjing Township (TW); Sheng-Yuan Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 350 days.

(21) Appl. No.: 17/303,309

(22) Filed: May 26, 2021

(65) Prior Publication Data
US 2022/0293436 A1    Sep. 15, 2022

Related U.S. Application Data

(60) Provisional application No. 63/200,511, filed on Mar. 11, 2021.

(51) Int. Cl.
*B23K 1/00* (2006.01)
*H01L 21/67* (2006.01)
*H01L 21/687* (2006.01)

(52) U.S. Cl.
CPC ...... *H01L 21/67017* (2013.01); *B23K 1/0016* (2013.01); *H01L 21/67092* (2013.01); *H01L 21/67103* (2013.01); *H01L 21/68764* (2013.01)

(58) Field of Classification Search
CPC ......... H01L 21/67017; H01L 21/67092; H01L 21/67103; H01L 21/68764;
(Continued)

(56) References Cited

U.S. PATENT DOCUMENTS

| 6,347,636 B1 * | 2/2002 | Xia ............... H01L 21/67017 134/1.1 |
| 2003/0178467 A1 * | 9/2003 | Lee ..................... G02F 1/1339 228/42 |

(Continued)

FOREIGN PATENT DOCUMENTS

| CN | 101351874 A * | 1/2009 | ........... B23K 1/0016 |
| CN | 102691041 A * | 9/2012 | ........... C23C 14/246 |

(Continued)

*Primary Examiner* — Kiley S Stoner
(74) *Attorney, Agent, or Firm* — Harrity & Harrity, LLP

(57) ABSTRACT

A bonding tool includes a gas supply line that may extend directly between valves associated with one or more gas supply tanks and a processing chamber such that gas supply line is uninterrupted without any intervening valves or other types of structures that might otherwise cause a pressure buildup in the gas supply line between the processing chamber and the valves associated with the one or more gas supply tanks. The pressure in the gas supply line may be maintained at or near the pressure in the processing chamber so that gas provided to the processing chamber through the gas supply line does not cause a pressure imbalance in the processing chamber, which might otherwise cause early or premature contact between semiconductor substrates that are to be bonded in the processing chamber.

8 Claims, 14 Drawing Sheets

(58) Field of Classification Search
CPC ......... H01L 21/67028; H01L 21/67253; H01L 24/74; H01L 24/80; H01L 2224/74; H01L 2224/80; B08B 5/00; B23K 1/00–206; B23K 3/00–087; B23K 2101/36–42
USPC ..... 228/179.1–180.22, 218–220, 6.1–6.2, 42
See application file for complete search history.

(56) References Cited

U.S. PATENT DOCUMENTS

| | | | |
|---|---|---|---|
| 2004/0083588 A1* | 5/2004 | Park | H01L 21/67017 29/25.01 |
| 2008/0274288 A1* | 11/2008 | Kondo | C23C 16/4408 427/294 |
| 2015/0011095 A1* | 1/2015 | Chandrasekharan | C23C 16/4412 438/758 |
| 2016/0336170 A1* | 11/2016 | Ishida | H01L 21/67051 |
| 2019/0201949 A1* | 7/2019 | Okita | B01D 46/0017 |
| 2020/0098603 A1* | 3/2020 | Kamakura | C23C 16/45561 |
| 2020/0361013 A1* | 11/2020 | Aoki | B23K 3/0638 |
| 2021/0296141 A1* | 9/2021 | Omori | H01L 21/67098 |
| 2022/0293436 A1* | 9/2022 | Huang | H01L 21/67017 |
| 2023/0197408 A1* | 6/2023 | Takeda | H01L 21/0214 438/478 |

FOREIGN PATENT DOCUMENTS

| | | | | |
|---|---|---|---|---|
| CN | 103718273 A | * | 4/2014 | ....... H01L 21/67017 |
| CN | 104600019 A | * | 5/2015 | ........... B23K 1/0016 |
| CN | 104968462 A | * | 10/2015 | ........... B23K 1/0016 |
| CN | 105374704 A | * | 3/2016 | ........... C23C 16/345 |
| CN | 106449408 A | * | 2/2017 | ........ C23C 16/0254 |
| CN | 108213630 A | * | 6/2018 | ............. B23K 1/008 |
| CN | 111199918 A | * | 5/2020 | ............. C23C 16/24 |
| DE | 102010015841 A1 | * | 9/2010 | ............. B23K 1/008 |
| DE | 112015004107 T5 | * | 6/2017 | ............. B23K 1/002 |
| EP | 1862711 A2 | * | 12/2007 | ....... H01L 21/67017 |
| EP | 3854492 A1 | * | 7/2021 | ......... C23C 16/4405 |
| JP | 2004111739 A | * | 4/2004 | ....... H01L 21/02142 |
| JP | 4288297 B1 | * | 7/2009 | ............. B23K 20/02 |
| JP | 4554078 B2 | * | 9/2010 | ....... H01L 21/67017 |
| JP | 2020136301 A | * | 8/2020 | ........... C23C 16/345 |
| KR | 100442310 B1 | * | 7/2004 | |
| KR | 20060133262 A | * | 12/2006 | |
| KR | 20160134510 A | * | 11/2016 | |
| KR | 20180044192 A | * | 5/2018 | |
| KR | 20210011061 A | * | 1/2021 | |
| KR | 20210093167 A | * | 7/2021 | |
| KR | 20230009788 A | * | 1/2023 | |
| WO | WO-2010018621 A1 | * | 2/2010 | ......... B23K 15/0006 |
| WO | WO-2011137068 A2 | * | 11/2011 | ....... H01L 21/67017 |
| WO | WO-2012002273 A1 | * | 1/2012 | ........... B23K 1/0016 |
| WO | WO-2012164776 A1 | * | 12/2012 | ........... B23K 1/0016 |
| WO | WO-2020047442 A1 | * | 3/2020 | ........... B23K 1/0016 |

* cited by examiner

SEMICONDUCTOR SUBSTRATE BONDING TOOL AND METHODS OF OPERATION

CROSS-REFERENCE TO RELATED APPLICATION

This patent application claims priority to U.S. Provisional Patent Application No. 63/200,511, filed on Mar. 11, 2021, and entitled "WAFER BONDING TOOL AND METHODS OF OPERATION." The disclosure of the prior Application is considered part of and is incorporated by reference into this patent Application.

BACKGROUND

Bonding in the semiconductor industry is a technique that may be used to form stacked semiconductor devices and three-dimensional integrated circuits. Some examples of bonding include wafer to wafer bonding, die to wafer bonding, and die to die bonding. Some examples of bonding techniques include fusion bonding, eutectic bonding, and hybrid bonding.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
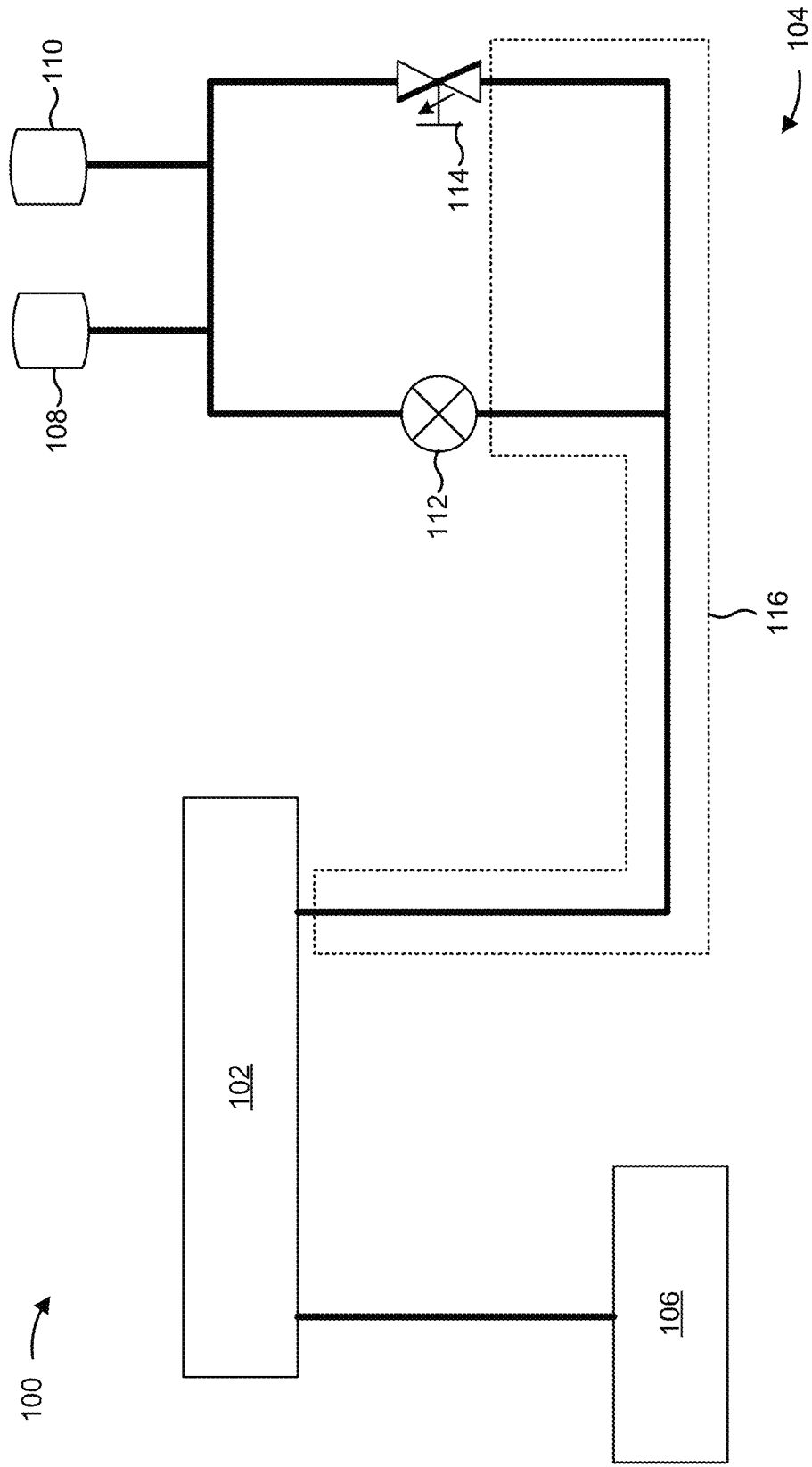
FIGS. 1A and 1B are diagrams of an example bonding tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various types of gasses may be introduced into a processing chamber of a bonding tool to reduce and/or prevent oxidation or other types of contamination prior to bonding a first semiconductor substrate and a second semiconductor substrate. The processing chamber may then be pumped down to a partial vacuum in preparation for bonding. Introduction of a gas into the processing chamber while the processing chamber is pressurized may result in a burst effect, in which the greater pressure of the gas relative to the pressure in the processing chamber causes the first semiconductor substrate to deform and prematurely touch or contact the second semiconductor substrate. This early or premature contact may occur between various portions of the first semiconductor substrate and various portions of the second semiconductor substrate. The early or premature contact may result in bonding uniformity issues across the first semiconductor substrate and the second semiconductor substrate, which can cause local area yield loss on the first semiconductor substrate and the second semiconductor substrate and/or malfunctions of devices on the first semiconductor substrate and the second semiconductor substrate.

Some implementations described herein provide a bonding tool and methods of operation that may reduce, minimize, and/or prevent early or premature contact between semiconductor substrates that are to be bonded. In some implementations, the bonding tool includes a gas supply line that is configured to supply or provide various types of gasses to a processing chamber of the bonding tool. The gas supply line may extend directly between valves associated with one or more gas supply tanks and the processing chamber such that gas supply line is uninterrupted without any intervening valves or other types of structures that might otherwise cause a pressure buildup in the gas supply line between the processing chamber and the valves associated with the one or more gas supply tanks. In this way, the pressure in the gas supply line may be maintained at or near the pressure in the processing chamber so that gas provided to the processing chamber through the gas supply line does not cause a pressure imbalance in the processing chamber that might otherwise cause early or premature contact between semiconductor substrates that are to be bonded in the processing chamber. Accordingly, the gas supply line of the bonding tool described herein may increase bonding uniformity across semiconductor substrates that are to be bonded, may decrease local area yield loss on semiconductor substrates that are to be bonded, and/or may reduce malfunctions of devices on semiconductor substrates that are to be bonded.

Figure 1B:
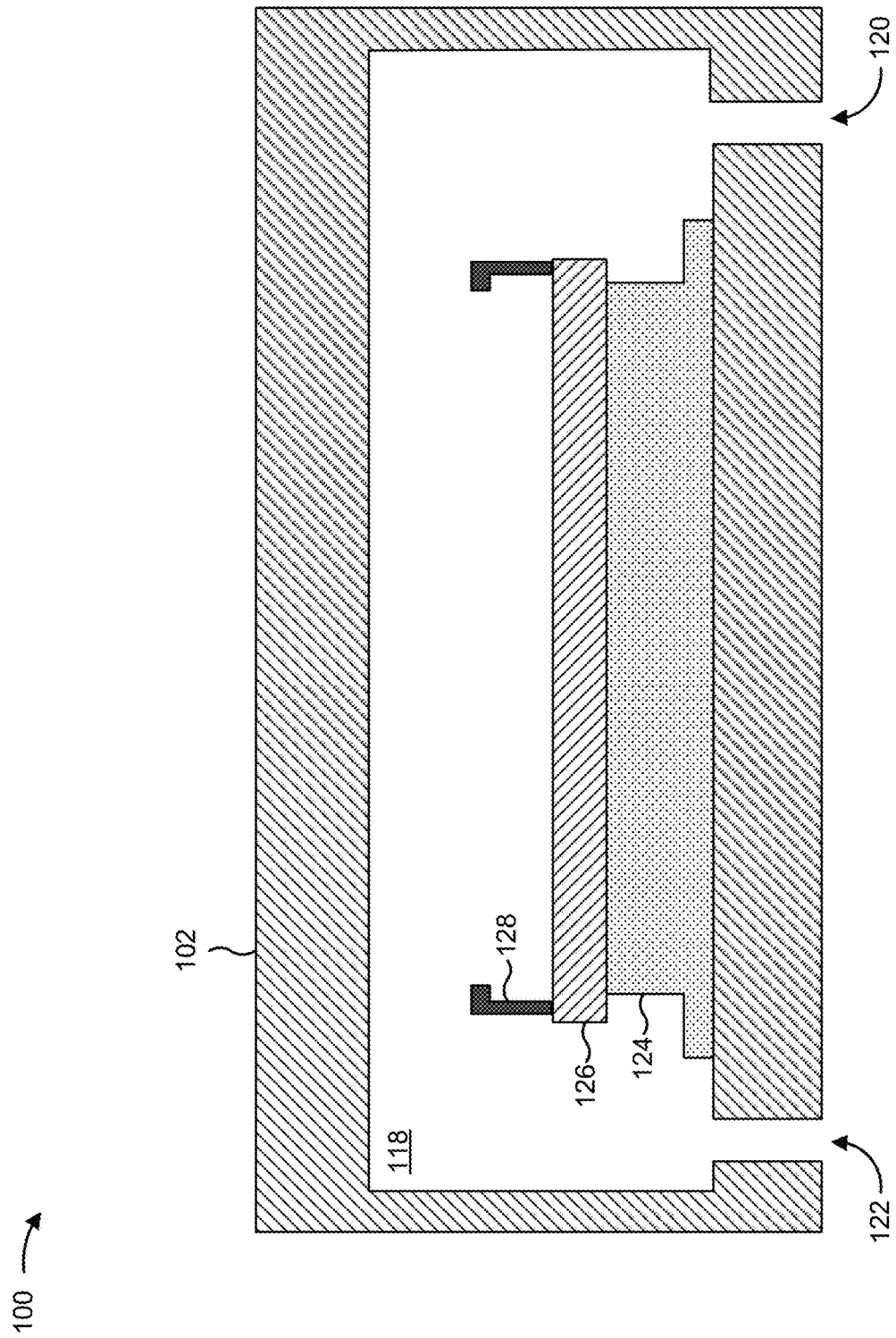

FIGS. 1A and 1B are diagrams of an example bonding tool 100 described herein. The bonding tool 100 is a semiconductor processing tool that is capable of bonding two or more semiconductor substrates (e.g., two or more semiconductor wafers, two or more portions of a semiconductor device such as a photomask or a reticle, two or more semiconductor devices, two or more semiconductor substrates, among other examples) together. For example, the bonding tool 100 may include a eutectic bonding tool that is capable of forming a eutectic bond between two or more semiconductor substrates by heating the two or more semiconductor substrates to form a eutectic system between the materials of the two or more semiconductor substrates. As another example, the bonding tool 100 may include a fusion bonding tool, which may form a direct bond between two or more semiconductor substrates (e.g., without the use of additional intermediate layers between the two or more semiconductor substrates) by pre-bonding the two or more semiconductor substrates (e.g., at or near room temperature) and annealing the two or more semiconductor substrates to complete the direct bond. In some implementations, the bonding tool 100 bonds two or more semiconductor substrates using a combination of bonding techniques, which may be referred to as hybrid bonding.

As shown in FIG. 1A, the bonding tool 100 may include a processing chamber 102 in which two or more semiconductor substrates may be supported and bonded. The processing chamber 102 may include a sealed chamber that is configured to be heated to an elevated temperature and pumped down to a vacuum or a partial vacuum (e.g., in a range of approximately 0 millibar (mbar) to approximately 950 mbar). The processing chamber 102 may be configured to be hermetically sealed to minimize contaminant and humidity ingress and to maintain the internal environment within the processing chamber 102 at and/or within a particular temperature range and/or a particular pressure range.

The processing chamber 102 may be connected with a gas supply system 104, which may be configured to supply various types of processing gasses to the processing chamber 102 in support of semiconductor substrate bonding. The various types of gasses may be used to purge the processing chamber 102 of atmospheric gasses, contaminants, humidity, and/or other environmental conditions in the processing chamber 102, and/or may be used to control the environment within the processing chamber 102 during a bonding operation to bond two or more semiconductor substrates.

The processing chamber 102 may also be connected to a pump 106, which may be configured to pressurize the processing chamber 102 by pumping gas out of the processing chamber 102. The pump 106 may include a servo pump that is configured to maintain the pressure within the processing chamber 102 based on negative feedback, or may include another type of pump.

The gas supply system 104 may include various components such as various types of valves, pipes, filters, and/or other types of plumbing fixtures. As shown in FIG. 1A, the gas supply system 104 may include a plurality of gas supply tanks, such as a bonding gas supply tank 108 and a purge gas supply tank 110. The bonding gas supply tank 108 may include a gas storage tank that is configured to store and supply a bonding gas that is to be used in a bonding operation performed by the bonding tool 100. The bonding gas may include an inert gas such as argon (Ar), nitrogen ($N_2$), and/or another inert gas. The purge gas supply tank 110 may include a gas storage tank that is configured to store a purge gas that is to be used to purge the processing chamber 102 of the bonding gas. The purge gas may include an inert gas, extra clean dry air, extreme extra clean dry air, and/or another type of gas.

As further shown in FIG. 1A, the gas supply system 104 may include a first valve 112 and a second valve 114, among other valves. The first valve 112 may include a binary flow valve that is configured to selectively block and permit the flow of gas through the gas supply system 104. In other words, the first valve 112 may include a two-position valve that is capable of being selectively configured in a first position to block the flow of gas through the gas supply system 104 to the processing chamber 102 or in a second position to permit the flow of gas through the gas supply system to the processing chamber 102. The second valve 114 may include a variable valve or variable flow valve that is configured to regulate or modulate the flow of gas through the gas supply system 104 to the processing chamber 102. For example, the second valve 114 may be configured to control (e.g., adjust, increase, decrease, modulate, and/or regulate) the flow rate of gas through the gas supply system 104 to the processing chamber 102 to maintain, in combination with the pump 106, the pressure within the processing chamber 102 at a near-constant pressure within a particular pressure range or within a tolerance of a particular pressure setting.

As further shown in FIG. 1A, the gas supply system 104 may include a gas supply line 116. The gas supply line 116 may include one or more pipes or tubes that are configured to supply and/or provide various types of gasses to the processing chamber 102. The gas supply line 116 may be configured to maintain a pressure in the gas supply line 116 and/or to provide gas to the processing chamber 102 at a pressure that is approximately equal to (or within a 5% tolerance, a 10% tolerance, or another tolerance of) a bonding pressure in the processing chamber 102. The bonding pressure in the processing chamber 102 may include a pressure at which semiconductor substrates are bonded in the processing chamber 102 by the bonding tool 100. In some implementations, the bonding pressure may be in a range of approximately 0 mbar to approximately 5 mbar to enable precise control over the environment in the processing chamber 102. Accordingly, the gas supply line 116 may be configured to maintain the pressure in the gas supply line 116 and/or to provide gas to the processing chamber 102 at a pressure that is in a range of approximately 0 mbar to approximately 5 mbar. However, other values for the pressure in the gas supply line 116 are within the scope of the present disclosure. This reduces, minimizes, and/or eliminates the likelihood that the pressure in the gas supply line 116 (and the pressure of gas provided to the processing chamber 102 through the gas supply line 116) will cause deflection or deformation of a semiconductor substrate in the processing chamber 102, which would otherwise cause early or premature contact or touching of the semiconductor substrate and another semiconductor substrate that are to be bonded.

As further shown in FIG. 1A, the gas supply line 116 may extend directly between the processing chamber 102 and the first valve 112, and may extend directly between the processing chamber 102 and the second valve 114. In particular, the pipes or tubes of the gas supply line 116 may extend between the processing chamber 102 and the valves 112, 114 uninterrupted without any intervening valves or other types of structures that might otherwise cause a pressure buildup in the gas supply line 116 between the processing chamber 102 and the valves 112, 114. The uninterrupted piping of the gas supply line 116 reduces, minimizes, and/or eliminates the likelihood that the pressure in the gas supply line 116 will cause a large and sudden pressure differential in the processing chamber 102, which might otherwise cause early or premature contact or touching of semiconductor substrates that are to be bonded in the processing chamber 102.

FIG. 1B illustrates various details of the processing chamber 102. As shown in FIG. 1B, the processing chamber 102 may include an internal space 118, a gas inlet 120, and a gas outlet 122. The gas inlet 120 may include a port, a nozzle, or another type of opening through which gas from the gas supply system 104 may be provided into the internal space 118 of the processing chamber 102. In particular, the gas supply line 116 may be coupled to the gas inlet 120 to provide gas into the internal space 118 of the processing chamber 102. The gas outlet 122 may include a port, a nozzle, or another type of opening through which gas may be purged or removed from the internal space 118 of the processing chamber 102. In particular, the pump 106 may be coupled to the gas outlet 122 (e.g., directly or by other intervening plumbing fixtures) and may pump gas out of the internal space 118 of the processing chamber 102 through the gas outlet 122.

As further shown in FIG. 1B, the processing chamber 102 may include various types of chucks in the internal space 118, such as a thermal chuck 124 and a bonding chuck 126, among other examples. The thermal chuck 124 may include a chuck that is configured to heat semiconductor substrates in the internal space 118 of the processing chamber 102 to an elevated temperature for eutectic bonding. The bonding chuck 126 may include a chuck that is configured to support and secure a semiconductor substrate that is to be bonded with another semiconductor substrate. The bonding chuck 126 may include a vacuum chuck or another type of chuck that is configured to minimize and/or prevent movement of a semiconductor substrate that is to be bonded with another semiconductor substrate.

As further shown in FIG. 1B, the processing chamber 102 may include a plurality of support members 128. The plurality of support members 128 may be located on and/or around the bonding chuck 126 such that the plurality of support members 128 are configured to suspend a semiconductor substrate over a semiconductor substrate that is located on the bonding chuck 126 in preparation for bonding. The plurality of support members 128 may include flags, standoffs, and/or other types of support members.

As indicated above, FIGS. 1A and 1B are provided as an example. Other examples may differ from what is described with regard to FIGS. 1A and 1B.

FIGS. 2A-2H are diagrams of an example implementation 200 described herein. The example implementation 200 may include an example process for bonding semiconductor substrates using the bonding tool 100 in a manner in which the likelihood of early or premature contact between the semiconductor substrates is minimized, as described herein.

Figure 2A:
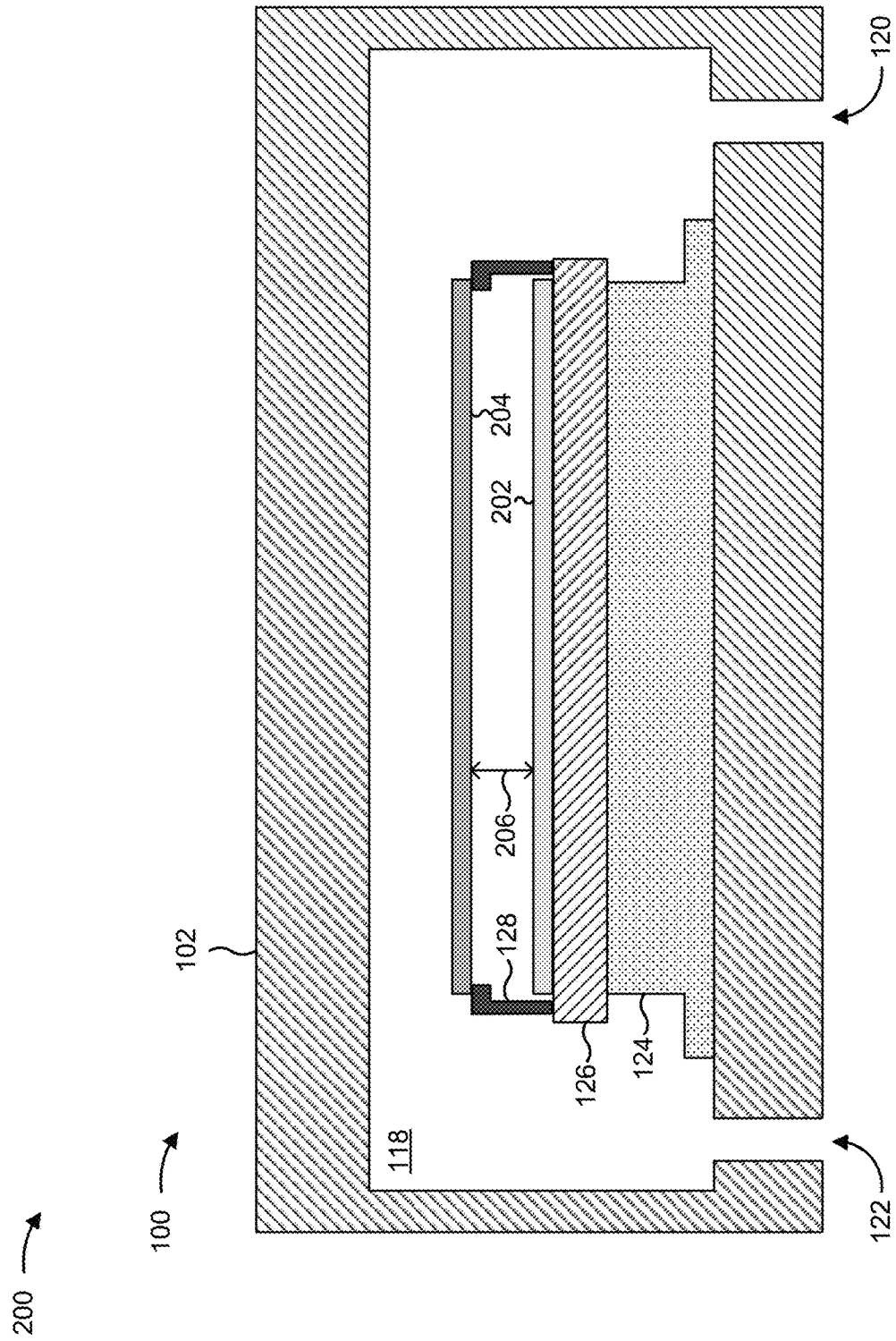
FIGS. 2A-2H are diagrams of an example implementation described herein.

As shown in FIG. 2A, a first semiconductor substrate 202 and a second semiconductor substrate 204 may be placed in the processing chamber 102 for bonding. In particular, the first semiconductor substrate 202 may be placed on the bonding chuck 126 in the internal space 118, and the second semiconductor substrate 204 may be placed on the plurality of support members 128 such that the second semiconductor substrate 204 is suspended over the first semiconductor substrate 202. In this way, the first semiconductor substrate 202 and the second semiconductor substrate 204 are spaced apart by a distance 206. The distance 206 may be in a range of approximately 90 microns to approximately 110 microns to reduce the likelihood of shifting of the second semiconductor substrate 204 during bonding (which may cause bonding misalignment between the first semiconductor substrate 202 and the second semiconductor substrate 204) and to reduce the likelihood of early or premature contact between the first semiconductor substrate 202 and the second semiconductor substrate 204. However, other values for the distance 206 are within the scope of the present disclosure. In some implementations, the first semiconductor substrate 202 and the second semiconductor substrate 204 are manually positioned in the processing chamber 102 (e.g., by clean room personnel). In some implementations, the first semiconductor substrate 202 and the second semiconductor substrate 204 are automatically positioned in the processing chamber 102 by a transport device such as a robot arm or an equipment front end module (EFEM) tool, among other examples.

Figure 2B:
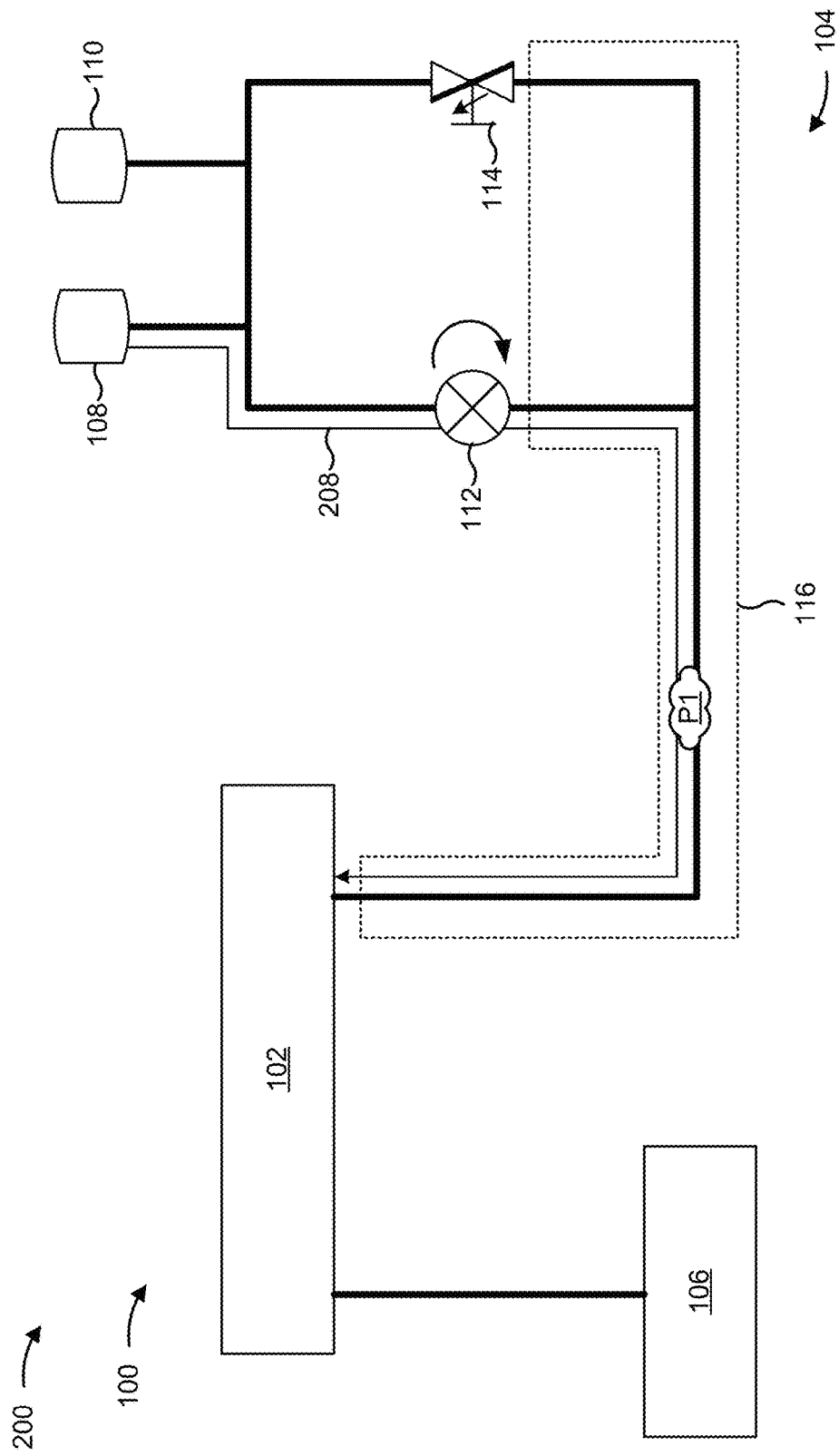

As shown in FIG. 2B, with the first semiconductor substrate 202 and the second semiconductor substrate 204 in the processing chamber 102, the bonding tool 100 may use the gas supply system 104 to provide a bonding gas 208 to the processing chamber 102 to purge the environment in the processing chamber 102. The bonding gas 208 may be used to purge the processing chamber 102 of contaminants (e.g., particles, dust, debris, and/or foreign objects), humidity, oxygen, and/or other environmental conditions. The bonding gas 208 may include an inert gas such as argon (Ar) or nitrogen ($N_2$), among other examples.

The bonding gas 208 may be supplied from the bonding gas supply tank 108 and through the first valve 112. In particular, the bonding gas 208 may flow from the bonding gas supply tank 108 to the first valve 112. The bonding tool 100 may actuate the first valve 112 to an open configuration in which the bonding gas 208 is permitted to flow through the first valve 112. The bonding gas 208 may flow from the first valve 112 to the processing chamber 102 through the gas supply line 116 at a pressure (P1). The pressure (P1) may be a relatively high pressure to quickly purge the environment in the processing chamber 102. As an example, the pressure (P1) may be approximately 1500 mbar or greater. In other examples, the pressure (P1) may be another pressure value.

Figure 2C:
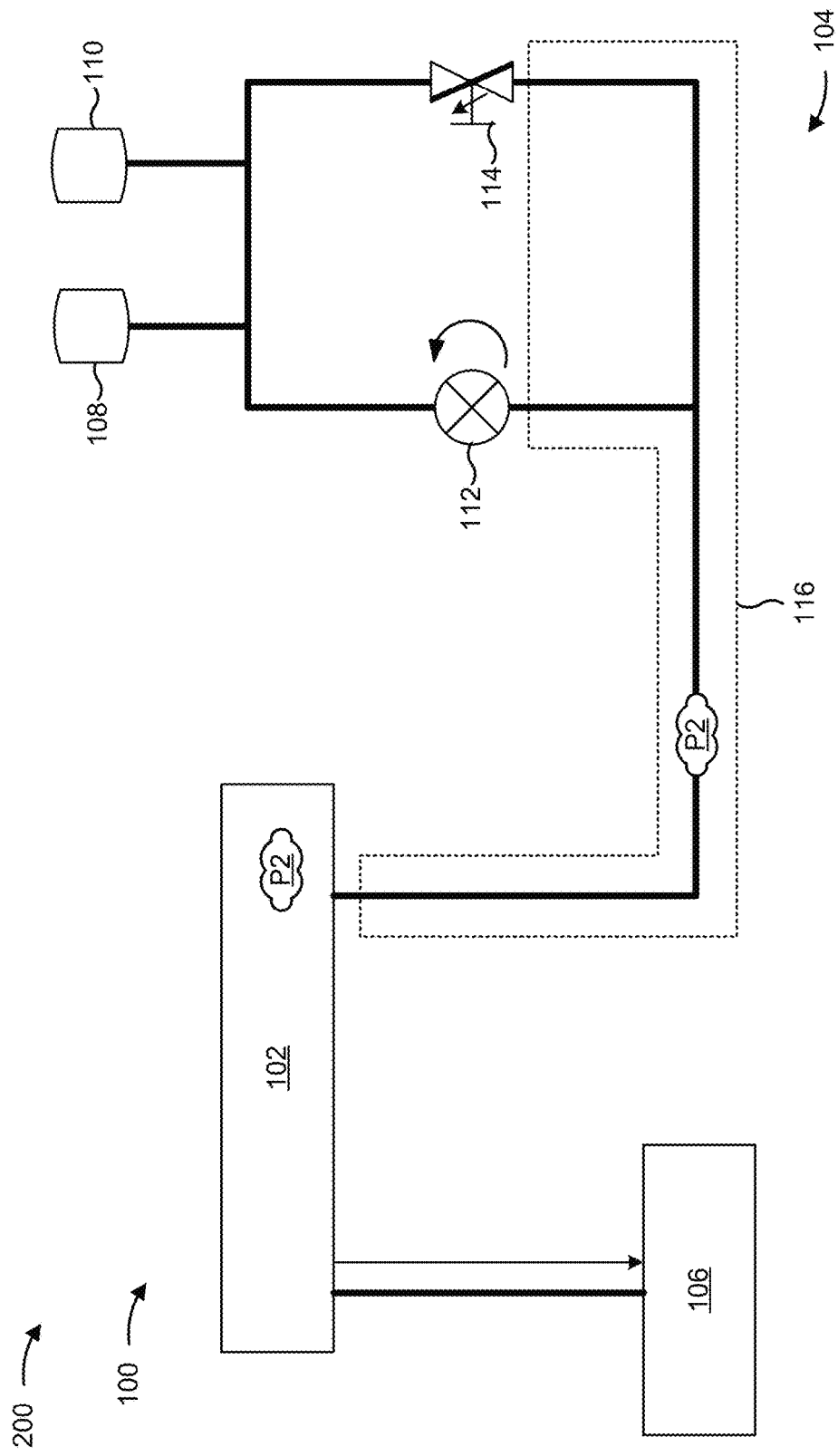

As shown in FIG. 2C, the bonding tool 100 may actuate the first valve 112 to a closed configuration in which the bonding gas 208 is blocked from flowing through the first valve 112 (and thus, through the gas supply line 116). The bonding tool 100 may activate the pump 106 to pump down the processing chamber 102 to a pressure (P2), which may correspond to the bonding pressure for bonding the first semiconductor substrate 202 and the second semiconductor substrate 204. In some implementations, the bonding pressure is in a range of approximately 0 mbar to approximately 5 mbar to enable precise control of the environment in the processing chamber 102, as described above. However, other values such as approximately 10 mbar, are within the scope of the present disclosure.

As further shown in FIG. 2C, the bonding tool 100 is enabled to maintain the pressure in the gas supply line 116 approximately equal to (or within a 5% tolerance, a 10% tolerance, or another tolerance of) the pressure in the processing chamber 102 (e.g., the bonding pressure, pressure (P2)). In particular, the pressure in the gas supply line 116 is capable of being maintained approximately equal to the pressure in the processing chamber 102 due to the gas supply line 116 extending directly between the processing chamber 102 and the valves 112, 114. In this way, there are no intervening valves, pumps, or other plumbing fixtures in the gas supply line 116 that might otherwise cause a residual amount of the high-pressure bonding gas 208 to remain in the gas supply line 116 after the first valve 112 is closed.

Figure 2D:
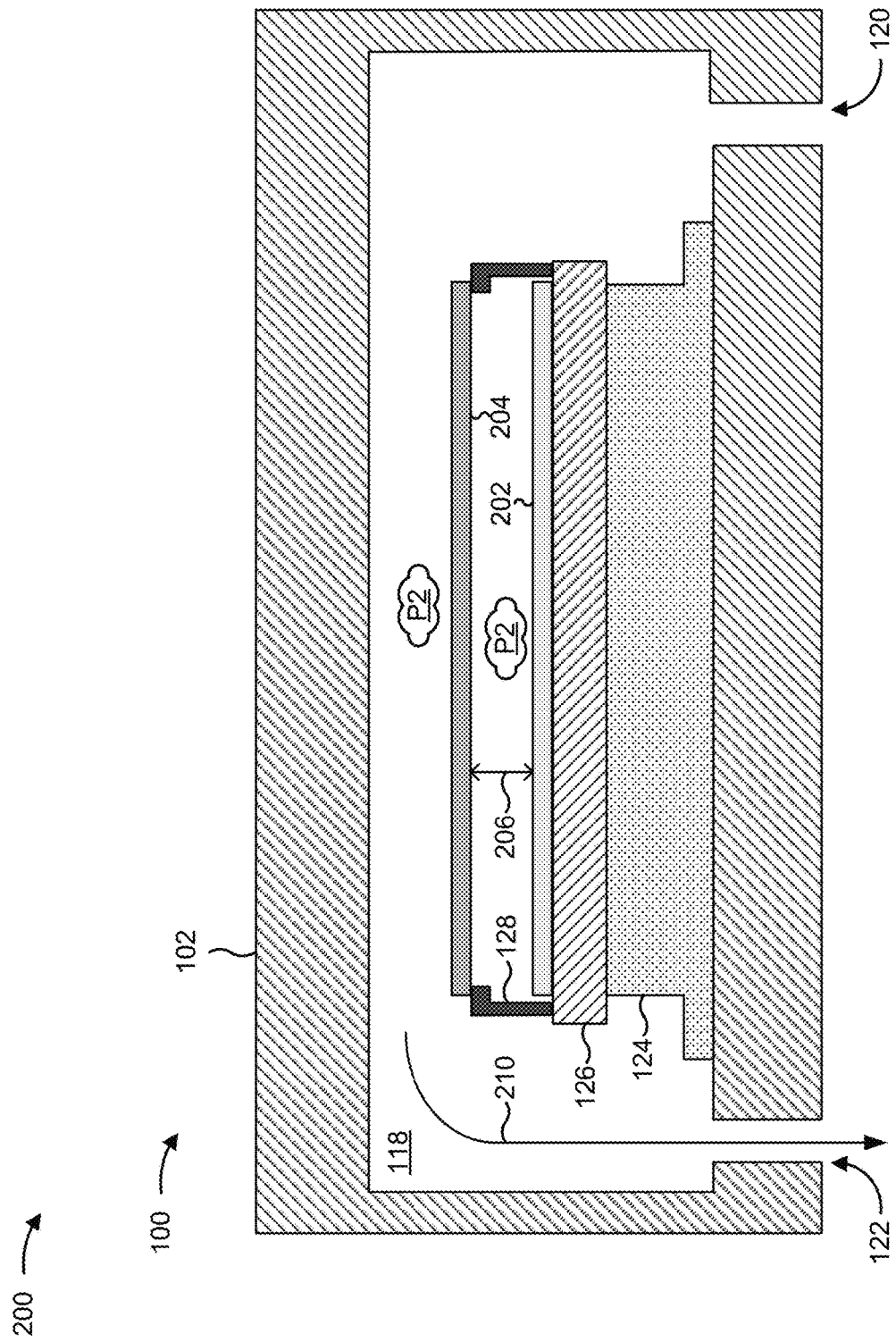

As shown in FIG. 2D, a gas mixture 210 may be purged from the internal space 118 of the processing chamber 102 through the gas outlet 122. In particular, the gas mixture 210 may be purged during pressurization of the processing chamber 102 to the bonding pressure. The gas mixture 210 may include a combination of the environmental gas in the processing chamber 102 and the bonding gas 208. As further shown in FIG. 2D, the pump 106 may pump the internal space 118 down to the pressure (P2) such that the pressure between the first semiconductor substrate 202 and the second semiconductor substrate 204, and the pressure in the internal space 118 of the processing chamber 102, are approximately equal.

Figure 2E:
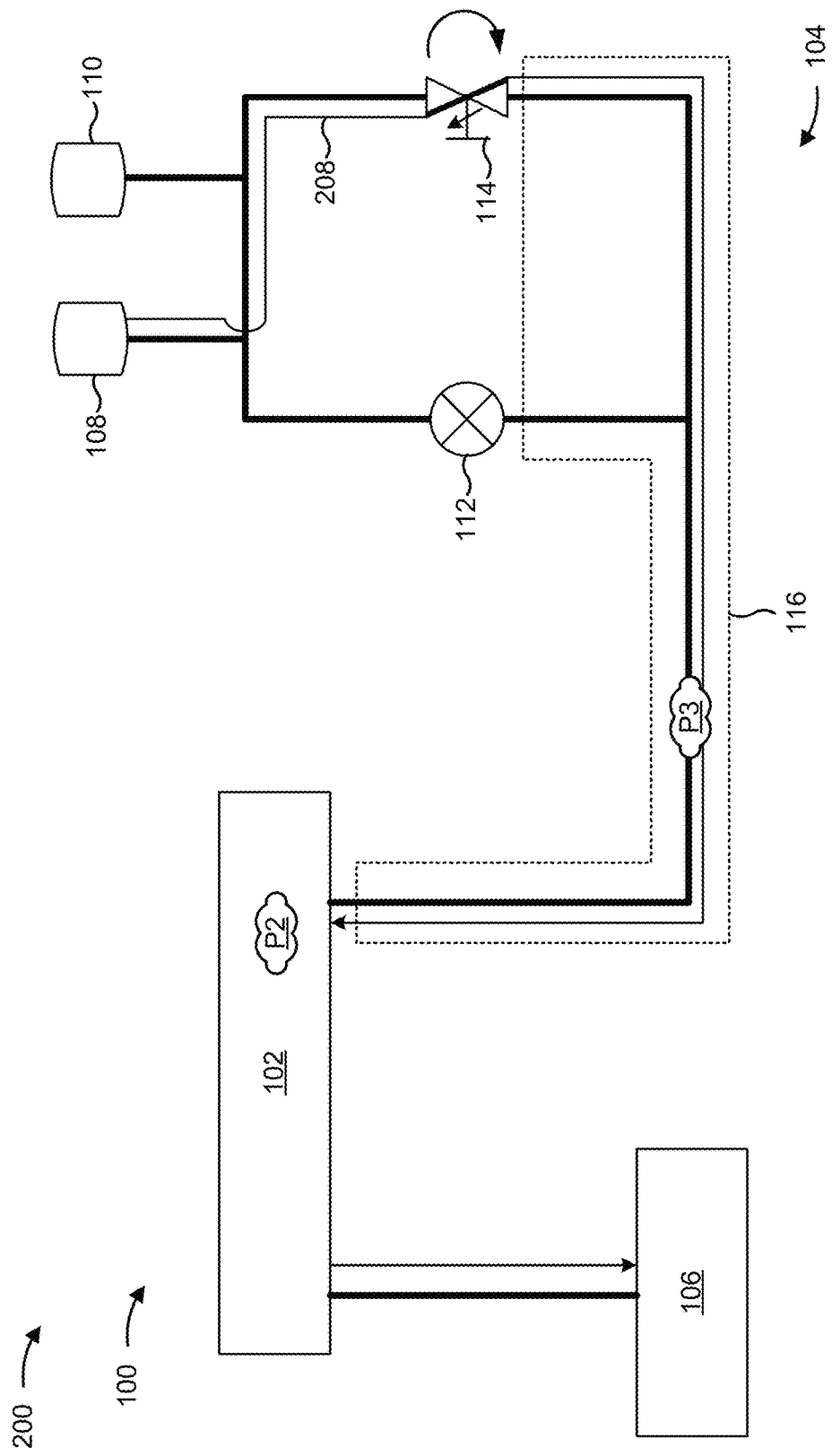

As shown in FIG. 2E, the bonding gas 208 may be provided to the processing chamber 102 to maintain the pressure in the processing chamber 102 approximately at the bonding pressure (e.g., the pressure (P2)). The bonding tool 100 may open the second valve 114 such that the bonding gas 208 is supplied from the bonding gas supply tank 108 through the second valve 114. The bonding gas 208 may flow from the second valve 114 to the bonding chamber 102 through the gas supply line 116. The pump 106 may continue pumping gas out of the processing chamber 102 as the bonding gas 208 is provided to the processing chamber 102 to control the environment within the processing chamber 102 (e.g., to control the humidity, the oxygen concentration, and/or the removal of contaminants). The pump 106 may continue pumping gas out of the processing chamber 102, and the second valve 114 may regulate and/or modulate the flow of the bonding gas 208 through the gas supply line 116 to the processing chamber 102, to maintain the pressure in the processing chamber 102 approximately at the bonding pressure (e.g., the pressure (P2)).

As further shown in FIG. 2E, the bonding gas 208 may be provided to the processing chamber at a pressure (P3). As indicated above, the gas supply line 116 may extend directly between the processing chamber 102 and the valves 112, 114 without any intervening valves or other plumbing structures so as to prevent a build-up of residual bonding gas 208 in the gas supply line 116 after the processing chamber 102 is pressurized to the bonding pressure (e.g., the pressure (P2)). In this way, the pressure (P3) may be approximately equal to (or within a 5% tolerance, a 10% tolerance, or another tolerance of) the pressure (P2) in the processing chamber 102, which may minimize the likelihood of and/or substantially prevent the first semiconductor substrate 202 and the second semiconductor substrate 204 touching prior to bonding the first semiconductor substrate 202 and the second semiconductor substrate 204. Accordingly, the pressure (P3) of the bonding gas 208 provided to the processing chamber 102 may be in a range of approximately 0 mbar to approximately 5 mbar such that a pressure differential between the pressure (P2) in the processing chamber 102 and the pressure (P3) of the bonding gas 208 in the gas supply line 116 is in a range of approximately 0 mbar to approximately 5 mbar. However, other values for the pressure (P3) are within the scope of the present disclosure.

Figure 2F:
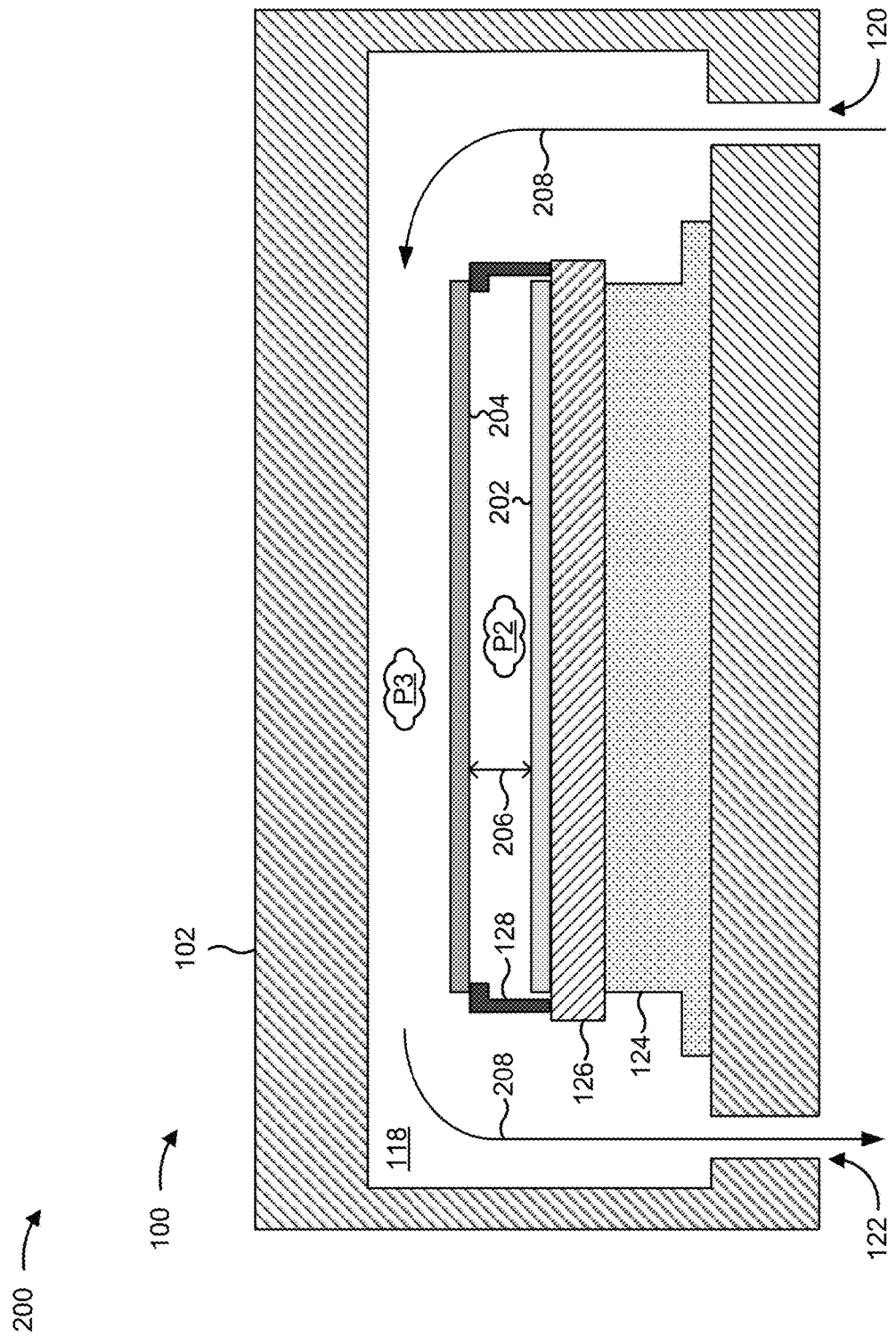

As shown in FIG. 2F, the bonding gas 208 may be provided into the internal space 118 of the processing chamber 102 through the gas inlet 120 of the processing chamber 102. The bonding gas 208 may flow through the internal space 118 of the processing chamber 102 and out of the processing chamber 102 through the gas outlet 122 as the pump 106 pumps the bonding gas 208 through the processing chamber 102. The pressure (P3) of the bonding gas 208 in the internal space 118 of the processing chamber 102 may be approximately equal to (or within a 5% tolerance, a 10% tolerance, or another tolerance of) the pressure (P2) in the internal space 118 between the first semiconductor substrate 202 and the second semiconductor substrate 204 to minimize deflection and/or deformation of the second semiconductor substrate 204 (which might otherwise cause early or premature contact between the first semiconductor substrate 202 and the second semiconductor substrate 204).

Figure 2G:
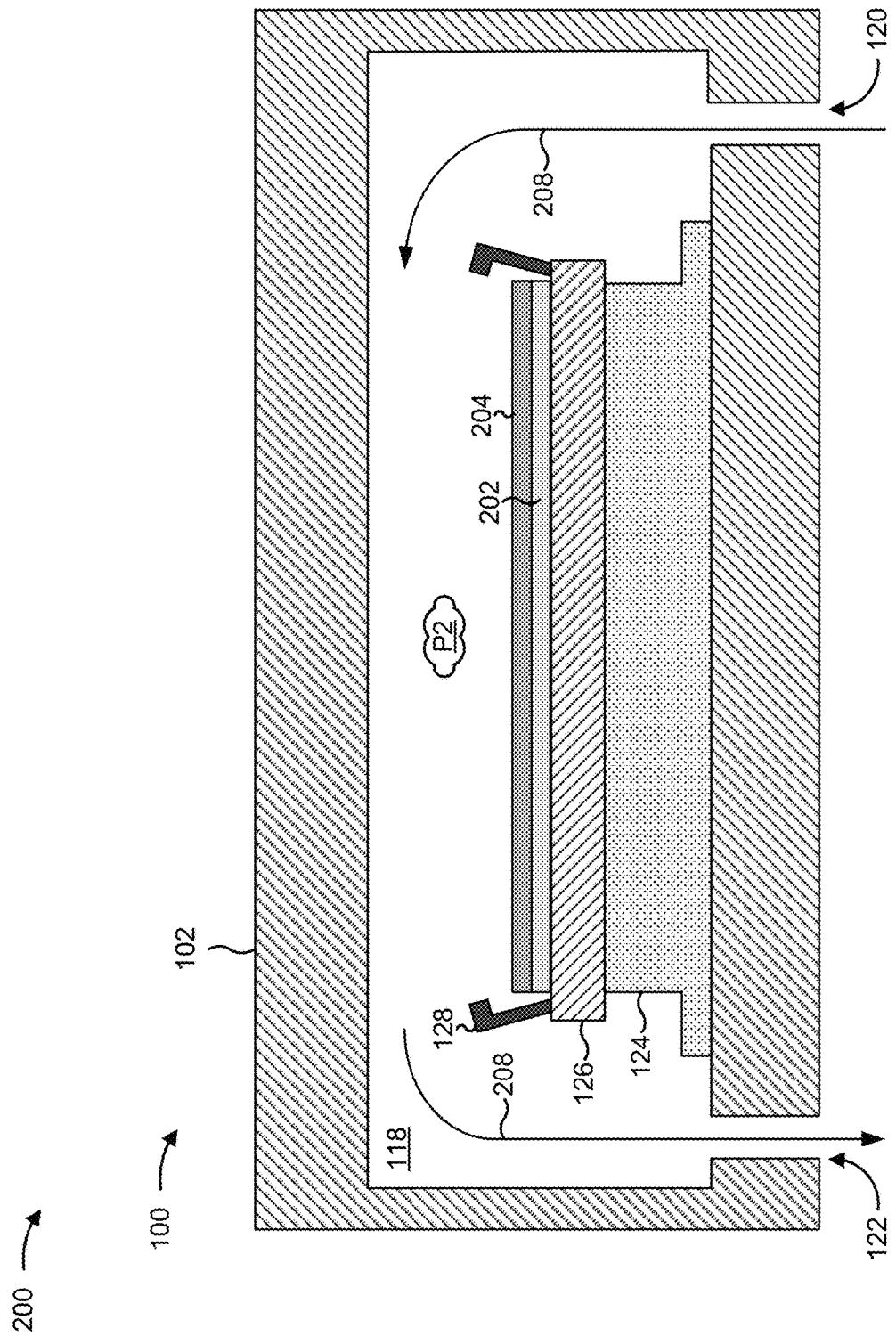

As shown in FIG. 2G, with the pressure (P2) in the internal space 118 of the processing chamber 102 maintained approximately at the bonding pressure, the bonding tool 100 may actuate the plurality of support members 128 to cause the second semiconductor substrate 204 to drop onto the first semiconductor substrate 202 to bond the first semiconductor substrate 202 and the second semiconductor substrate 204 as part of a bonding operation. The bonding tool 100 may bond the first semiconductor substrate 202 and the second semiconductor substrate 204 as the pump 106 and the second valve 114 continue to cause the bonding gas 208 to flow through the internal space 118 of the processing chamber 102. In some implementations, the bonding tool 100 increases (e.g., using the thermal chuck 124) the temperature in the internal space 118 of the processing chamber 102 to perform a eutectic bonding operation to bond the first semiconductor substrate 202 and the second semiconductor substrate 204.

Figure 2H:
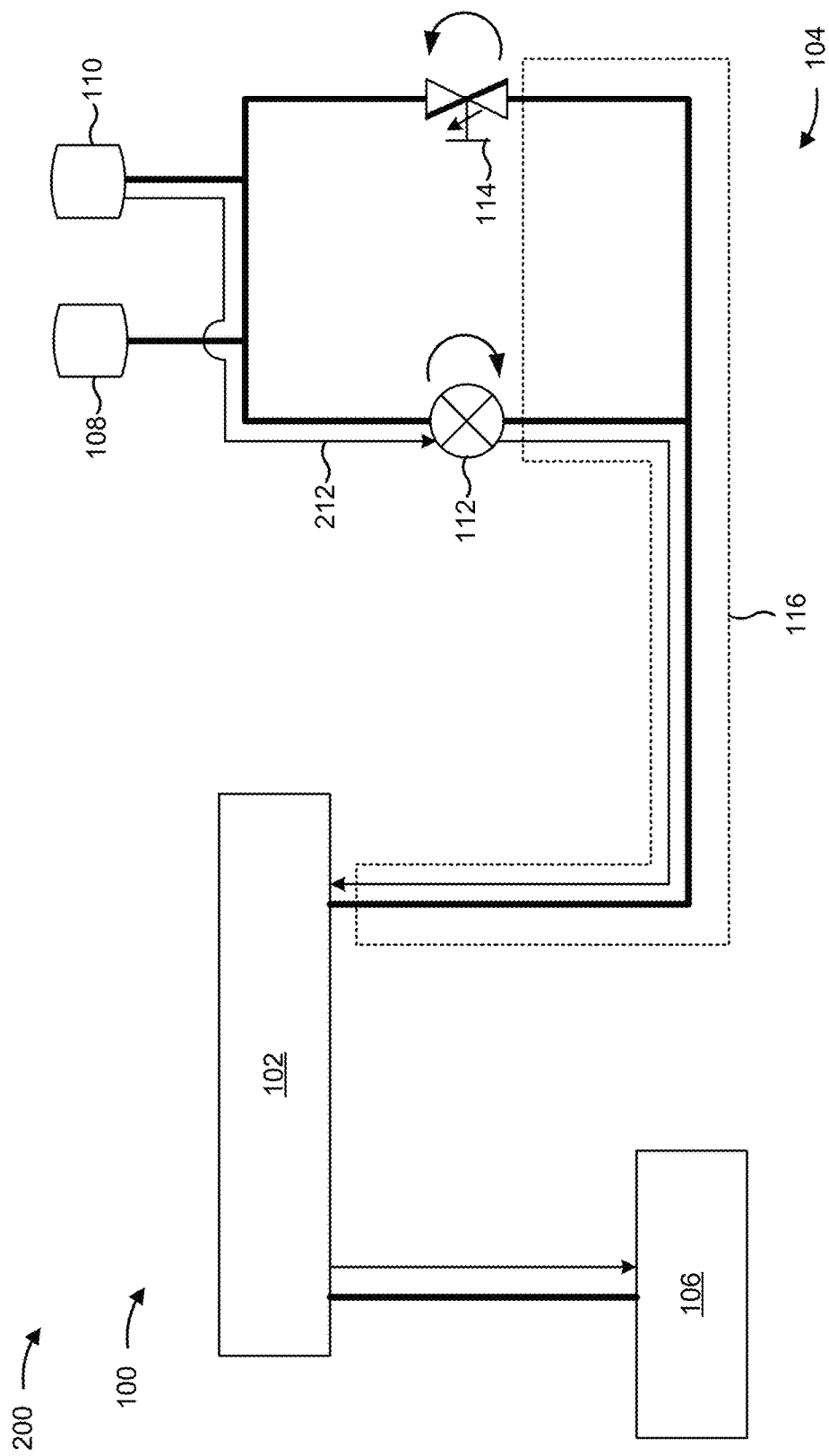

As shown in FIG. 2H, after bonding of the first semiconductor substrate 202 and the second semiconductor substrate 204, the bonding tool 100 may actuate the second valve 114 to a closed configuration to stop the flow of the bonding gas 208 to the processing chamber 102. The bonding tool 100 may then actuate the first valve 112 to an open configuration to permit a purge gas 212 to flow from the purge gas supply tank 110 through the first valve 112. The purge gas 212 may flow from the first valve 112 to the processing chamber 102 through the gas supply line 116. The purge gas 212 may flow into the processing chamber 102 to purge the processing chamber 102 of the bonding gas 208 and to depressurize the processing chamber 102 back to atmospheric pressure. The bonded first semiconductor substrate 202 and second semiconductor substrate 204 may then be removed from the processing chamber 102 for further processing.

As indicated above, FIGS. 2A-2H are provided as an example. Other examples may differ from what is described with regard to FIGS. 2A-2H.

Figure 3:
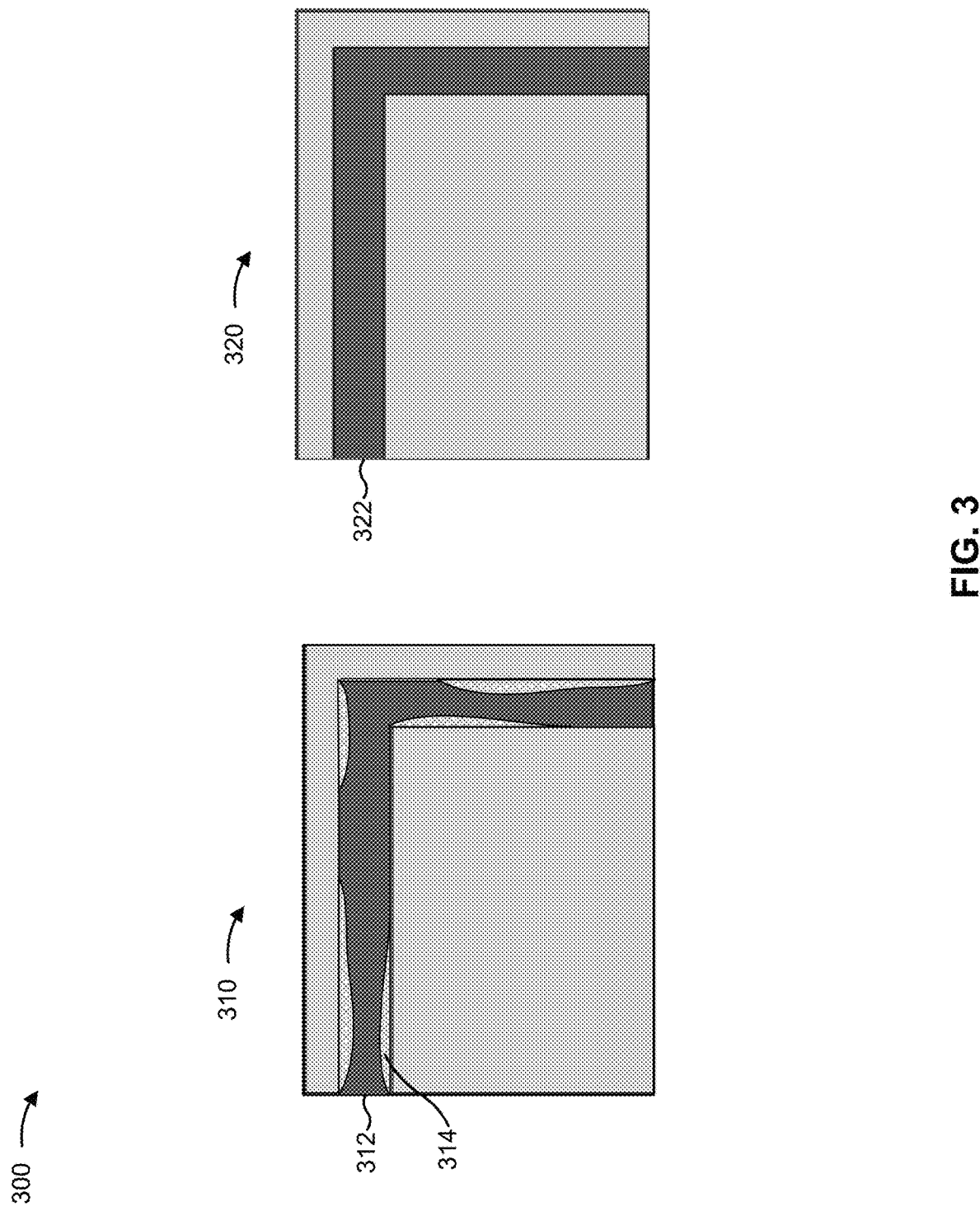
FIG. 3 is a diagram of an example of semiconductor substrate bonding performance described herein.

FIG. 3 is a diagram of an example 300 of semiconductor substrate bonding performance described herein. The example 300 may illustrate examples of semiconductor substrate bonding performance for a semiconductor device 310 and a semiconductor device 320.

The semiconductor device 310 may be bonded by a bonding tool in which bonding gas is maintained in a gas supply line at a much greater pressure relative to the pressure in the processing chamber of the bonding tool. For example, the bonding gas may be maintained in the gas supply line at a pressure of approximately 1500 mbar or greater, whereas the pressure in the processing chamber may be approximately 100 mbar. However, other values for the pressure of the bonding gas are within the scope of the present disclosure. As shown in FIG. 3, a bonding area 312 (or bonding interface) of the semiconductor device 310 may include one or more areas of imperfections 314. The imperfections 314 may include discontinuities or voids that may result from early or premature contact between semiconductor substrates that were bonded to form the semiconductor device 310.

The semiconductor device 320 may be bonded by the bonding tool 100 described herein, in which the bonding gas 208 is maintained in the gas supply line 116 at a pressure (e.g., the pressure (P3)) that is approximately equal to the pressure (e.g., the pressure (P2)) in the processing chamber 102 of the bonding tool 100. For example, the pressure of the bonding gas 208 in the gas supply line 116, and the pressure in the processing chamber 102 may both be in a range of approximately 0 mbar to approximately 5 mbar. However, other values for the pressure in the gas supply line 116 are within the scope of the present disclosure. As shown in FIG. 3, a bonding area 322 of the semiconductor device 320 may be absent (or near absent) of imperfections as a result of the approximately equal pressures in the processing chamber 102 and the gas supply line 116 substantially preventing early or premature contact between semiconductor substrates that were bonded to form the semiconductor device 320.

As indicated above, FIG. 3 is provided as an example. Other examples may differ from what is described with regard to FIG. 3.

Figure 4:
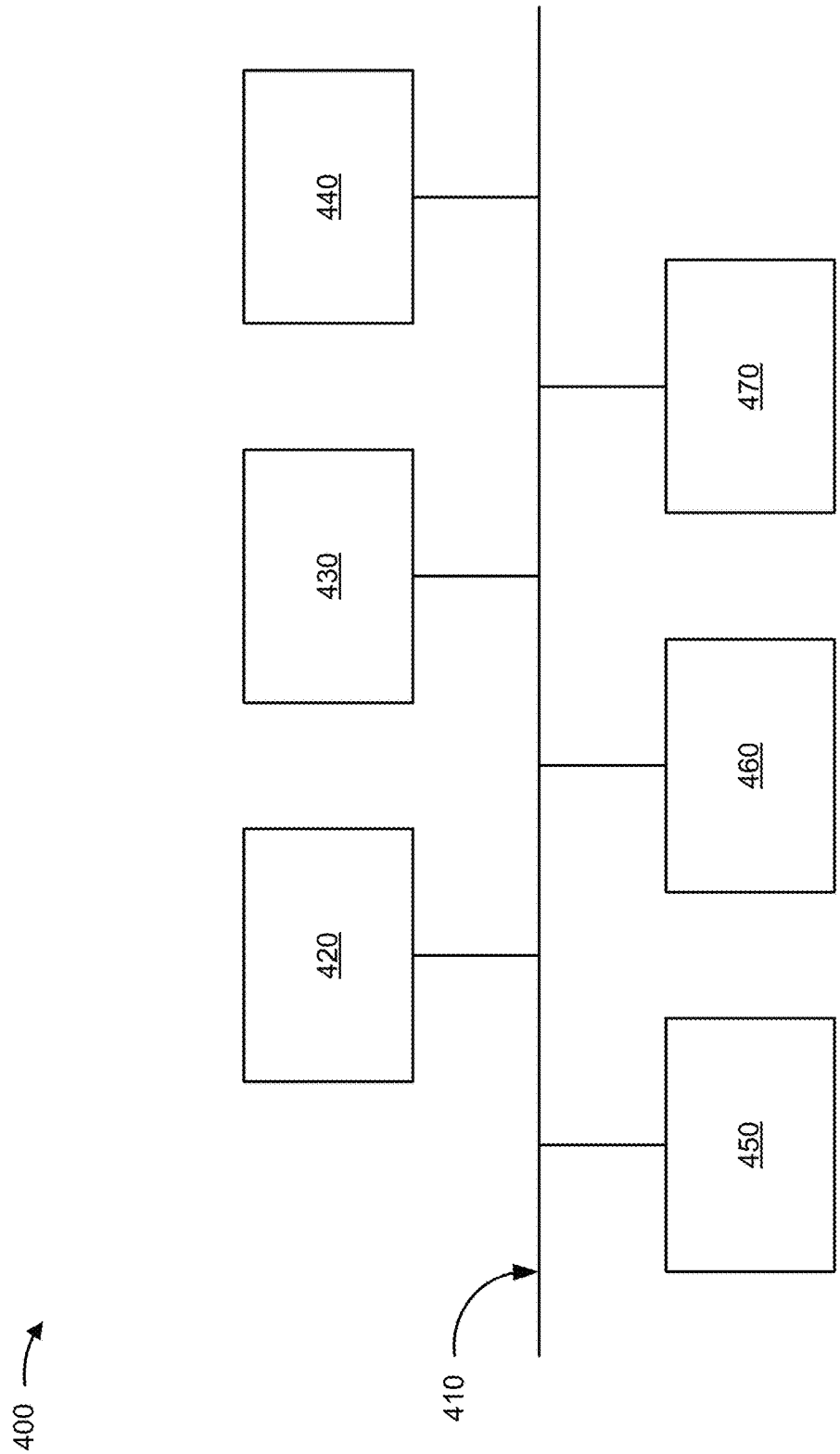
FIG. 4 is a diagram of example components of one or more devices of FIGS. 1A and 1B.

FIG. 4 is a diagram of example components of a device 400. In some implementations, the bonding tool 100 may include one or more devices 400 and/or one or more components of device 400. As shown in FIG. 4, device 400 may include a bus 410, a processor 420, a memory 430, a storage component 440, an input component 450, an output component 460, and a communication component 470.

Bus 410 includes a component that enables wired and/or wireless communication among the components of device 400. Processor 420 includes a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 includes one or more processors capable of being programmed to perform a function. Memory 430 includes a random access memory, a read only memory, and/or another type of memory (e.g., a flash memory, a magnetic memory, and/or an optical memory).

Storage component 440 stores information and/or software related to the operation of device 400. For example, storage component 440 may include a hard disk drive, a magnetic disk drive, an optical disk drive, a solid state disk drive, a compact disc, a digital versatile disc, and/or another type of non-transitory computer-readable medium. Input component 450 enables device 400 to receive input, such as user input and/or sensed inputs. For example, input component 450 may include a touch screen, a keyboard, a keypad, a mouse, a button, a microphone, a switch, a sensor, a global positioning system component, an accelerometer, a gyroscope, and/or an actuator. Output component 460 enables device 400 to provide output, such as via a display, a speaker, and/or one or more light-emitting diodes. Communication component 470 enables device 400 to communicate with other devices, such as via a wired connection and/or a wireless connection. For example, communication component 470 may include a receiver, a transmitter, a transceiver, a modem, a network interface card, and/or an antenna.

Device 400 may perform one or more processes described herein. For example, a non-transitory computer-readable medium (e.g., memory 430 and/or storage component 440) may store a set of instructions (e.g., one or more instructions, code, software code, and/or program code) for execution by processor 420. Processor 420 may execute the set of instructions to perform one or more processes described herein. In some implementations, execution of the set of instructions, by one or more processors 420, causes the one or more processors 420 and/or the device 400 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
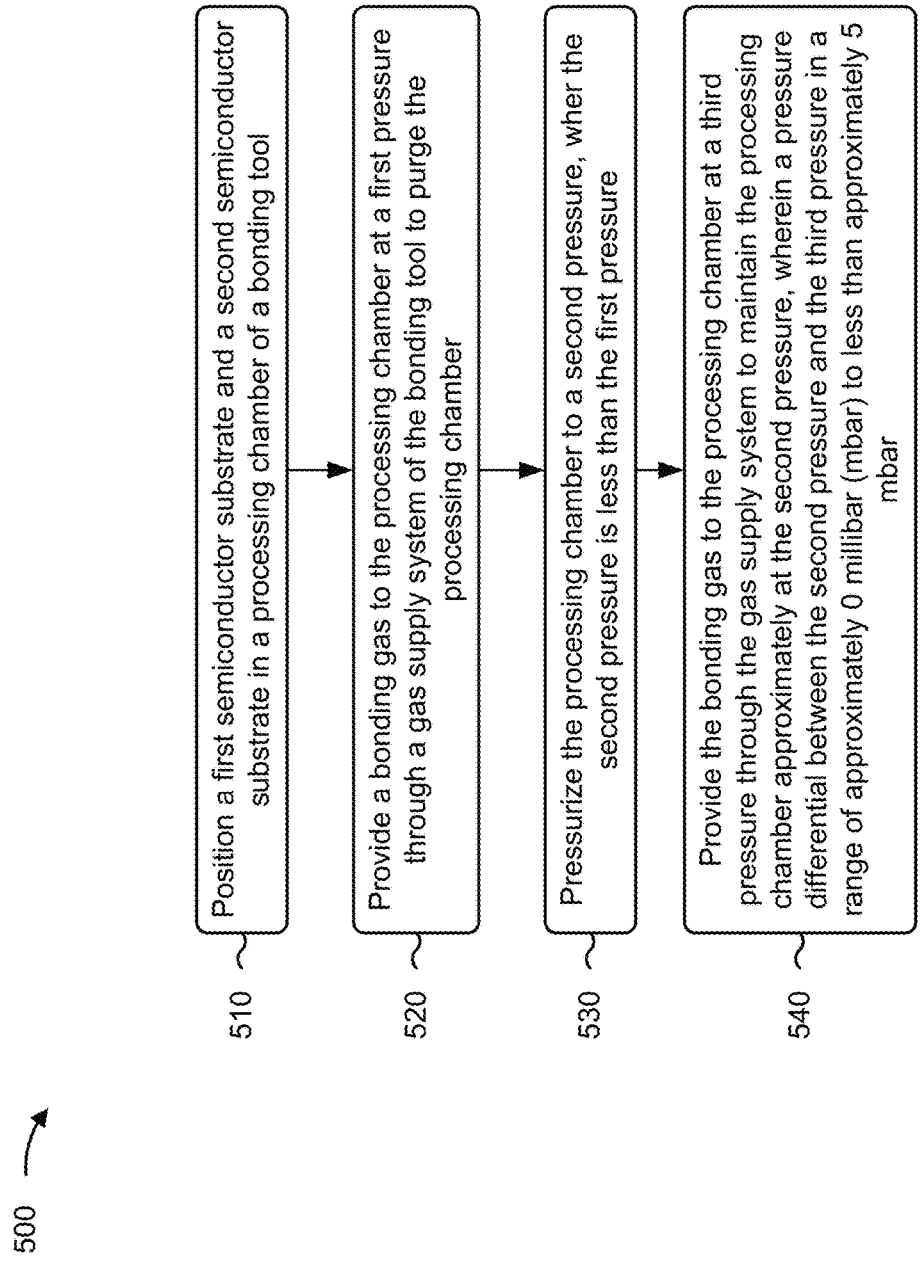
FIGS. 5 and 6 are flowcharts of example processes relating to semiconductor substrate bonding.

FIG. 5 is a flowchart of an example process 500 associated with bonding semiconductor substrates. In some implementations, one or more process blocks of FIG. 5 may be performed by a bonding tool (e.g., the bonding tool 100). Additionally, or alternatively, one or more process blocks of FIG. 5 may be performed by one or more components of device 400, such as processor 420, memory 430, storage component 440, input component 450, output component 460, and/or communication component 470.

As shown in FIG. 5, process 500 may include positioning a first semiconductor substrate and a second semiconductor substrate in a processing chamber of a bonding tool (block 510). For example, the first semiconductor substrate 202 and the second semiconductor substrate 204 may be placed in the processing chamber 102 of the bonding tool 100, as described above.

As further shown in FIG. 5, process 500 may include providing a bonding gas to the processing chamber at a first pressure through a gas supply system of the bonding tool to purge the processing chamber (block 520). For example, the bonding tool 100 may provide the bonding gas 208 to the processing chamber 102 at the first pressure (e.g., the pressure (P1)) through the gas supply system 104 of the bonding tool 100 to purge the processing chamber 102, as described above.

As further shown in FIG. 5, process 500 may include pressurizing the processing chamber to a second pressure, where the second pressure is less than the first pressure (block 530). For example, the bonding tool 100 may pressurize the processing chamber 102 to the second pressure (e.g., the pressure (P2)), as described above. In some implementations, the second pressure (e.g., the pressure (P2)) is less than the first pressure (e.g., the pressure (P1)).

As further shown in FIG. 5, process 500 may include providing the bonding gas to the processing chamber at a third pressure through the gas supply system to maintain the processing chamber approximately at the second pressure (block 540). For example, the bonding tool 100 may provide the bonding gas 208 to the processing chamber 102 at the third pressure (e.g., the pressure (P3)) through the gas supply system 104 to maintain the processing chamber 102 approximately at the second pressure (e.g., the pressure (P2)), as described above. In some implementations, a pressure differential between the second pressure and the third pressure in a range of approximately 0 mbar to less than approximately 5 mbar. However, other values for the pressure differential are within the scope of the present disclosure.

Process 500 may include additional implementations, such as any single implementation or any combination of implementations described below and/or in connection with one or more other processes described elsewhere herein.

In a first implementation, the third pressure (e.g., the pressure (P3)) is in a range of approximately 0 mbar to approximately 5 mbar. In a second implementation, alone or in combination with the first implementation, providing the bonding gas 208 to the processing chamber 102 at the first pressure (e.g., the pressure (P1)) through the gas supply system 104 includes providing the bonding gas 208 to the processing chamber 102 at the first pressure (e.g., the pressure (P1)) through the first valve 112 of the gas supply system 104 and through the gas supply line 116 that extends directly from the first valve 112 to the processing chamber 102 without an intervening valve. In a third implementation, alone or in combination with one or more of the first and second implementations, providing the bonding gas 208 to the processing chamber 102 at the third pressure (e.g., the pressure (P3)) through the gas supply system 104 to maintain the processing chamber 102 approximately at the second pressure (e.g., the pressure (P2)) includes providing the bonding gas 208 to the processing chamber 102 at the third pressure (e.g., the pressure (P3)) through the second valve 114 of the gas supply system 104 and through the gas supply line 116 that extends directly from the second valve 114 to the processing chamber 102 without an intervening valve.

In a fourth implementation, alone or in combination with one or more of the first through third implementations, the first valve 112 includes a binary flow valve and the second valve 114 includes a variable flow valve. In a fifth implementation, alone or in combination with one or more of the first through fourth implementations, process 500 includes bonding the first semiconductor substrate 202 and the second semiconductor substrate 204 while providing the bonding gas 208 to the processing chamber 102 at the third pressure (e.g., the pressure (P3)) through the gas supply system 104 to maintain the processing chamber 102 approximately at the second pressure (e.g., the pressure (P2)). In a sixth implementation, alone or in combination with one or more of the first through fifth implementations, providing the bonding gas 208 to the processing chamber 102 at the third pressure (e.g., the pressure (P3)) through the gas supply system 104 to maintain the processing chamber 102 approximately at the second pressure (e.g., the pressure (P2)) includes providing the bonding gas 208 to the processing chamber 102 at the third pressure (e.g., the pressure (P3)) through the gas supply system 104 to maintain the processing chamber 102 approximately at the second pressure (e.g., the pressure (P3)) to minimize the likelihood of the first semiconductor substrate (202) and the second semiconductor substrate (204) touching prior to bonding the first semiconductor substrate (202) and the second semiconductor substrate (204).

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6:
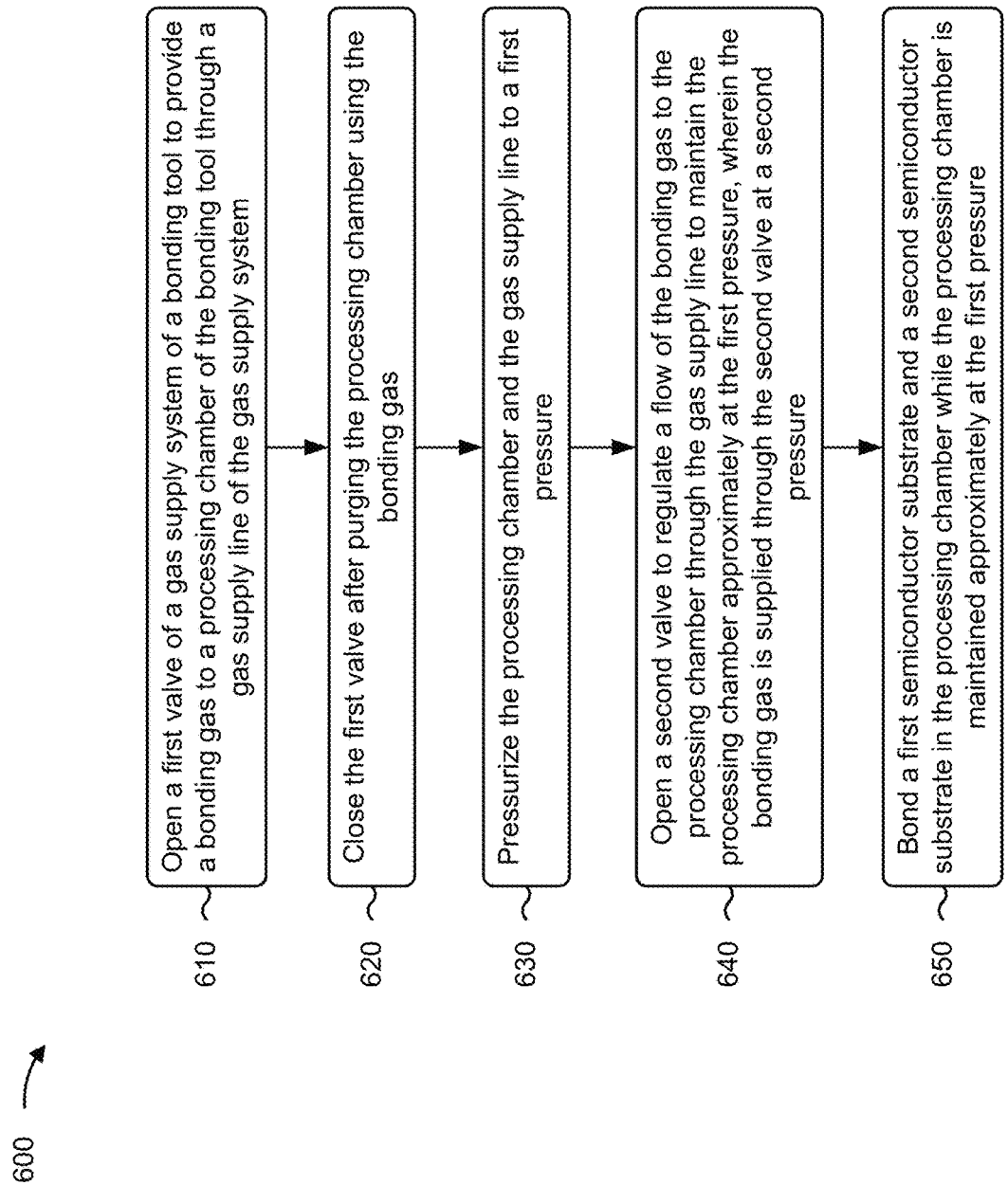

FIG. 6 is a flowchart of an example process 600 associated with bonding semiconductor substrates. In some implementations, one or more process blocks of FIG. 6 may be performed by a bonding tool (e.g., the bonding tool 100). Additionally, or alternatively, one or more process blocks of FIG. 6 may be performed by one or more components of device 400, such as processor 420, memory 430, storage component 440, input component 450, output component 460, and/or communication component 470.

As shown in FIG. 6, process 600 may include opening a first valve of a gas supply system of a bonding tool to provide a bonding gas to a processing chamber of the bonding tool through a gas supply line of the gas supply system (block 610). For example, the bonding tool 100 may open the first valve 112 of the gas supply system 104 of the bonding tool 100 to provide the bonding gas 208 to the processing chamber 102 of the bonding tool 100 through the gas supply line 116 of the gas supply system 104, as described above.

As further shown in FIG. 6, process 600 may include closing the first valve after purging the processing chamber using the bonding gas (block 620). For example, the bonding tool 100 may close the first valve 114 after purging the processing chamber 102 using the bonding gas 208, as described above.

As further shown in FIG. 6, process 600 may include pressurizing the processing chamber and the gas supply line to a first pressure (block 630). For example, the bonding tool 100 may pressurize the processing chamber 102 and the gas supply line 116 to a first pressure (e.g., the pressure (P2)), as described above.

As further shown in FIG. 6, process 600 may include opening a second valve to regulate a flow of the bonding gas to the processing chamber through the gas supply line to maintain the processing chamber approximately at the first pressure, where the bonding gas is supplied through the second valve at a second pressure (block 640). For example, the bonding tool 100 may open the second valve 114 to regulate a flow of the bonding gas 208 to the processing chamber 102 through the gas supply line 116 to maintain the processing chamber 102 approximately at the first pressure (e.g., the pressure (P2)), as described above. In some implementations, the bonding gas 208 is supplied through the second valve 114 at a second pressure (e.g., the pressure (P3)).

As further shown in FIG. 6, process 600 may include bonding a first semiconductor substrate and a second semiconductor substrate in the processing chamber while the processing chamber is maintained approximately at the first pressure (block 650). For example, the bonding tool 100 may bond the first semiconductor substrate 202 and the second semiconductor substrate 204 in the processing chamber 102 while the processing chamber 102 is maintained approximately at the first pressure (e.g., the pressure (P2)), as described above.

Process 600 may include additional implementations, such as any single implementation or any combination of implementations described below and/or in connection with one or more other processes described elsewhere herein.

In a first implementation, process 600 includes closing the second valve 114 after bonding the first semiconductor substrate 202 and the second semiconductor substrate 204, and opening the first valve 112 to provide the purge gas 212 to the processing chamber 102 through the gas supply line 116 to purge the processing chamber 102 of the bonding gas 208 and to depressurize the processing chamber 102. In a second implementation, alone or in combination with the first implementation, the first pressure (e.g., the pressure (P2)) and the second pressure (e.g., the pressure (P3)) are each in a range of approximately 0 mbar to approximately 10 mbar. In a third implementation, alone or in combination with one or more of the first and second implementations, process 600 includes placing the first semiconductor substrate 202 on a chuck (e.g., the bonding chuck 126) in the processing chamber 102, and placing the second semiconductor substrate 204 on the plurality of support members 128 in the processing chamber 102, and bonding the first semiconductor substrate 202 and the second semiconductor substrate 204 includes actuating the plurality of support members 128 to cause the second semiconductor substrate 204 to drop onto the first semiconductor substrate 202.

In a fourth implementation, alone or in combination with one or more of the first through third implementations, the distance 206 between the first semiconductor substrate 202 on the chuck (e.g., the bonding chuck 126) and the second semiconductor substrate 204 on the plurality of support members 128 is in a range of approximately 90 microns to approximately 110 microns. In a fifth implementation, alone or in combination with one or more of the first through fourth implementations, bonding the first semiconductor substrate 202 and the second semiconductor substrate 204 includes increasing a temperature in the processing chamber 102 to perform a eutectic bonding operation to bond the first semiconductor substrate 202 and the second semiconductor substrate 204.

In a sixth implementation, alone or in combination with one or more of the first through fifth implementations, the first valve 114 includes a binary flow valve and the second valve 114 includes a variable flow valve. In a seventh implementation, alone or in combination with one or more of the first through sixth implementations, the processing chamber 102 and the gas supply line 116 are pressurized to the first pressure (e.g., the pressure (P2)) to substantially prevent the first semiconductor substrate 202 and the second semiconductor substrate 204 from touching prior to bonding the first semiconductor substrate 202 and the second semiconductor substrate 204.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In this way, the bonding tool described herein may reduce, minimize, and/or prevent early or premature contact between semiconductor substrates that are to be bonded. In some implementations, the bonding tool includes a gas supply line that is configured to supply or provide various types of gasses to a processing chamber of the bonding tool. The gas supply line may extend directly between valves associated with one or more gas supply tanks and the processing chamber such that gas supply line is uninterrupted without any intervening valves or other types of structures that might otherwise cause a pressure buildup in the gas supply line between the processing chamber and the valves associated with the one or more gas supply tanks. In this way, the pressure in the gas supply line may be maintained at or near the pressure in the processing chamber so that gas provided to the processing chamber through the gas supply line does not cause a pressure imbalance in the processing chamber that might otherwise cause early or premature contact between semiconductor substrates that are to be bonded in the processing chamber. Accordingly, the gas supply line of the bonding tool described herein may increase bonding uniformity across semiconductor substrates that are to be bonded, may decrease local area yield loss on semiconductor substrates that are to be bonded, and/or may reduce malfunctions of devices on semiconductor substrates that are to be bonded.

As described in greater detail above, some implementations described herein provide a bonding tool. The bonding tool includes a processing chamber. The bonding tool includes a pump configured to pump the processing chamber down to a bonding pressure. The bonding tool includes a gas supply system configured to provide a bonding gas to the processing chamber through a gas supply line of the gas supply system, where the gas supply line extends directly between a valve, that is configured to control a flow of the bonding gas from a bonding gas supply tank to the processing chamber through the gas supply line, and a gas inlet of the processing chamber.

As described in greater detail above, some implementations described herein provide a method. The method includes positioning a first semiconductor substrate and a second semiconductor substrate in a processing chamber of a bonding tool. The method includes providing a bonding gas to the processing chamber at a first pressure through a gas supply system of the bonding tool to purge the processing chamber. The method includes pressurizing the processing chamber to a second pressure, where the second pressure is less than the first pressure. The method includes providing the bonding gas to the processing chamber at a third pressure through the gas supply system to maintain the processing chamber approximately at the second pressure, where a pressure differential between the second pressure and the third pressure in a range of approximately 0 millibar (mbar) to less than approximately 5 mbar.

As described in greater detail above, some implementations described herein provide a method. The method includes opening a first valve of a gas supply system of a bonding tool to provide a bonding gas to a processing chamber of the bonding tool through a gas supply line of the gas supply system. The method includes closing the first valve after purging the processing chamber using the bonding gas. The method includes pressurizing the processing chamber to a first pressure and the gas supply line to a second pressure, where the first pressure and the second pressure are approximately equal. The method includes opening a second valve to regulate a flow of the bonding gas to the processing chamber through the gas supply line to maintain the processing chamber approximately at the first pressure. The method includes bonding a first semiconductor substrate and a second semiconductor substrate in the processing chamber while the processing chamber is maintained approximately at the first pressure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    opening a first valve of a gas supply system of a bonding tool to provide a bonding gas to a processing chamber of the bonding tool through a gas supply line of the gas supply system;
    closing the first valve after purging the processing chamber using the bonding gas;
    pressurizing the processing chamber and the gas supply line to a first pressure;
    opening a second valve to regulate a flow of the bonding gas to the processing chamber through the gas supply line to maintain the processing chamber approximately at the first pressure,
        wherein the bonding gas is supplied through the second valve at a second pressure; and
    bonding a first semiconductor substrate and a second semiconductor substrate in the processing chamber while the processing chamber is maintained approximately at the first pressure.

2. The method of claim 1, further comprising:
    closing the second valve after bonding the first semiconductor substrate and the second semiconductor substrate; and opening the first valve to provide a purge gas to the processing chamber through the gas supply line to purge the processing chamber of the bonding gas and to depressurize the processing chamber.

3. The method of claim 1, wherein the first pressure and the second pressure are each in a range of approximately 0 millibar (mbar) to approximately 5 mbar.

4. The method of claim 1, further comprising:
placing the first semiconductor substrate on a chuck in the processing chamber; and
placing the second semiconductor substrate on a plurality of support members in the processing chamber,
wherein bonding the first semiconductor substrate and the second semiconductor substrate comprises:
actuating the plurality of support members to cause the second semiconductor substrate to drop onto the first semiconductor substrate.

5. The method of claim 4, wherein a distance between the first semiconductor substrate on the chuck and the second semiconductor substrate on the plurality of support members is in a range of approximately 90 microns to approximately 110 microns.

6. The method of claim 1, wherein bonding the first semiconductor substrate and the second semiconductor substrate comprises:
increasing a temperature in the processing chamber to perform a eutectic bonding operation to bond the first semiconductor substrate and the second semiconductor substrate.

7. The method of claim 6, wherein the first valve comprises a binary flow valve; and
wherein the second valve comprises a variable flow valve.

8. The method of claim 1, wherein the processing chamber and the gas supply line are pressurized to the first pressure to substantially prevent the first semiconductor substrate and the second semiconductor substrate from touching prior to bonding the first semiconductor substrate and the second semiconductor substrate.

* * * * *